United States Patent
Wang et al.

(10) Patent No.: US 11,337,344 B2
(45) Date of Patent: May 17, 2022

(54) SHIELDING MEMBER

(71) Applicant: ADVANCED-CONNECTEK INC., New Taipei (TW)

(72) Inventors: Wen-Yu Wang, New Taipei (TW); Ming-Yung Chang, New Taipei (TW); Tzu-Hao Li, New Taipei (TW); Yu-Xuan Tung, New Taipei (TW)

(73) Assignee: Advanced-Connectek Inc., New Taipei (TW)

( * ) Notice: Subject to any disclaimer, the term of this patent is extended or adjusted under 35 U.S.C. 154(b) by 0 days.

(21) Appl. No.: 17/198,689

(22) Filed: Mar. 11, 2021

(65) Prior Publication Data

US 2021/0289673 A1 Sep. 16, 2021

(30) Foreign Application Priority Data

Mar. 12, 2020 (TW) .................................. 109202863

(51) Int. Cl.
*H05K 9/00* (2006.01)
(52) U.S. Cl.
CPC ......... *H05K 9/0007* (2013.01); *H05K 9/0032* (2013.01); *H05K 9/0081* (2013.01)
(58) Field of Classification Search
CPC ................... H05K 9/0032; H05K 2201/0715
See application file for complete search history.

(56) References Cited

U.S. PATENT DOCUMENTS

| | | | | |
|---|---|---|---|---|
| 6,278,610 B1* | 8/2001 | Yasufuku | ............... | H01R 12/88 361/704 |
| 8,373,076 B2* | 2/2013 | Cao | ..................... | H05K 9/0037 174/382 |
| 2012/0031661 A1* | 2/2012 | Tan | ..................... | H05K 9/0032 174/377 |
| 2017/0223822 A1* | 8/2017 | Xu | ..................... | H05K 1/0216 |
| 2018/0310441 A1* | 10/2018 | Chang | .................. | H05K 9/0024 |
| 2021/0112674 A1* | 4/2021 | Ehlen | .................. | H05K 5/0026 |

* cited by examiner

*Primary Examiner* — Hung V Ngo
(74) *Attorney, Agent, or Firm* — Muncy, Geissler, Olds & Lowe, P.C.

(57) ABSTRACT

A shielding member includes a frame body and an outer cover. Two sides of a first end of the frame body respectively include a first shaft portion. Two sides of the frame body respectively include a first side plate. The frame body is covered by the outer cover. Two sides of a first end of the outer cover respectively include a second shaft portion, and each of the second shaft portions is pivotally connected to the corresponding first shaft portion. Two sides of the outer cover respectively include a second side plate, and each of the second side plates covers an outer side of the corresponding first side plate. Accordingly, the frame body and the outer cover are assembled to form a one-piece metallic shielding member. The structure of the shielding member is simple, the manufacturing for the shielding member is easy, and the cost for manufacturing the shielding member is reduced.

17 Claims, 15 Drawing Sheets

SHIELDING MEMBER

CROSS-REFERENCE TO RELATED APPLICATION

This non-provisional application claims priority under 35 U.S.C. § 119(a) to Patent Application No. 109202863 filed in Taiwan, R.O.C. on Mar. 12, 2020, the entire contents of which are hereby incorporated by reference.

FIELD OF THE INVENTION

The instant disclosure relates to a cover, and more particular to a shielding member.

BACKGROUND

For an electronic device (e.g., a notebook computer), the size of the electronic device is small, and the electronic device has a relatively limited internal space. Therefore, the circuit boards are electrically connected with each other through welding wires or board-to-board (BTB) electrical connector(s), so that the electronic device can have better space utilization.

SUMMARY OF THE INVENTION

In general, the metallic shielding member is a metallic element adapted to be provided out of an integrated circuit (IC) chip or an electronic component for shielding electromagnetic interferences (EMI). Hence, interferences caused by noises from outside or from the electronic component itself can be prevented, so that the signal transmission of the electronic component can be prevented from being affected by the noises.

A metallic shielding member known to the inventor includes two pieces, the shielding cover and the shielding frame, respectively. Another metallic shielding member known to the inventor includes a shielding cover and has a reduced manufacturing cost. However, it is understood that, the aforementioned metallic shielding members known to the inventor cannot be detached from the shielded electronic component easily, and the assembly for the metallic shielding members is also time-consuming. Moreover, after the shielding cover is detached from the shielded electronic component, the shielding cover is deformed and cannot be reused again. As a result, another shielding cover is needed for repairing the metallic shielding member, causing a higher repairing cost for the metallic shielding member. In further another metallic shielding member, instead of the shielding frame, a shielding clip is applied for the fixation of the member on the shielded electronic component. Nevertheless, some issues, such as the clamping force of the metallic shielding member; the larger gap between the metallic shielding member and the shielded electronic component, and the height of the shielding cover of the metallic shielding member, still occur to the metallic shielding member with the shielding clip and to be solved.

One embodiment of the instant disclosure provides a shielding member. The shielding member comprises a frame body and an outer cover. Two sides of a first end of the frame body respectively comprise a first shaft portion, and two sides of the frame body respectively comprise a first side plate. The frame body is covered by the outer cover. Two sides of a first end of the outer cover respectively comprise a second shaft portion, and each of the second shaft portions is pivotally connected to the corresponding first shaft portion. Two sides of the outer cover respectively comprise a second side plate, and each of the second side plates covers an outer side of the corresponding first side plate.

In one or some embodiments, a second end of the frame body opposite to the first end of the frame body comprises a first bottom plate, a second end of the outer cover opposite to the first end of the outer cover comprises a second block, and an opening is formed between the first bottom plate and the second block.

In one or some embodiments, each of the first shaft portions comprises a rotation shaft protruding from a side end of the corresponding first side plate, each of the second shaft portions comprises a shaft hole formed on a side end of the corresponding second side plate, and each of the rotation shafts is inserted into the corresponding shaft hole.

In one or some embodiments, each of the first shaft portions comprises a shaft hole formed on a side end of the corresponding first side plate, each of the second shaft portions comprises a rotation shaft protruding from a side end of the corresponding second side plate, and each of the rotation shafts is inserted into the corresponding shaft hole.

In one or some embodiments, the frame body comprises a first fixation portion, the outer cover comprises a second fixation portion, and the second fixation portion is engaged with the first fixation portion.

In one or some embodiments, the first fixation portion comprises an engaging groove formed on a side end of each of the first side plates, and two sides of the second block are respectively engaged with the engaging grooves.

In one or some embodiments, the second block extends toward the first bottom plate and covers the opening.

In one or some embodiments, a top plate reversely extends from the first end of the outer cover, and an end portion of the top plate extends into the frame body.

In one or some embodiments, each of the first side plates comprises a plurality of first engaging portions, the first engaging portions are spacedly configured on each of the first side plates, each of the second side plates comprises a plurality of second engaging portions, and the second engaging portions of each of the second side plates are respectively engaged with the first engaging portion of the corresponding first side plate and an inner wall of the corresponding first side plate.

In one or some embodiments, the frame body comprises a plurality of leg portions at the first side plates and the first bottom plate.

In one or some embodiments, a fixation member is on a surface of the outer cover for contacting a circuit board.

According to one or some embodiments of the instant disclosure, the frame body and the outer cover are assembled to form a one-piece metallic shielding member. The structure of the shielding member is simple, the manufacturing for the shielding member is easy, and the cost for manufacturing the shielding member is reduced. The shielding member is adapted to provide a great EMI protection. The outer cover is rotatable on the frame body, so that the detachment of the shielding member from the shielded electronic component as well as the assembly of the shielding member can be achieved easily. Hence, the assembly time and the rework time for the shielding member can be reduced. The shielding member can be fixed on the shielded electronic component without using screws. A one-time surface mount technology (SMT) procedure may be applied to a connector or an electronic component assembled with the shielding member, and the shielding member can be applied to board-to-board (BTB) connectors or other electronic components or connectors with the EMI shielding needs. The two sides of the frame body are covered by the two sides of the outer cover, so that the shielding member can shield the component with two metallic layers.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1A:
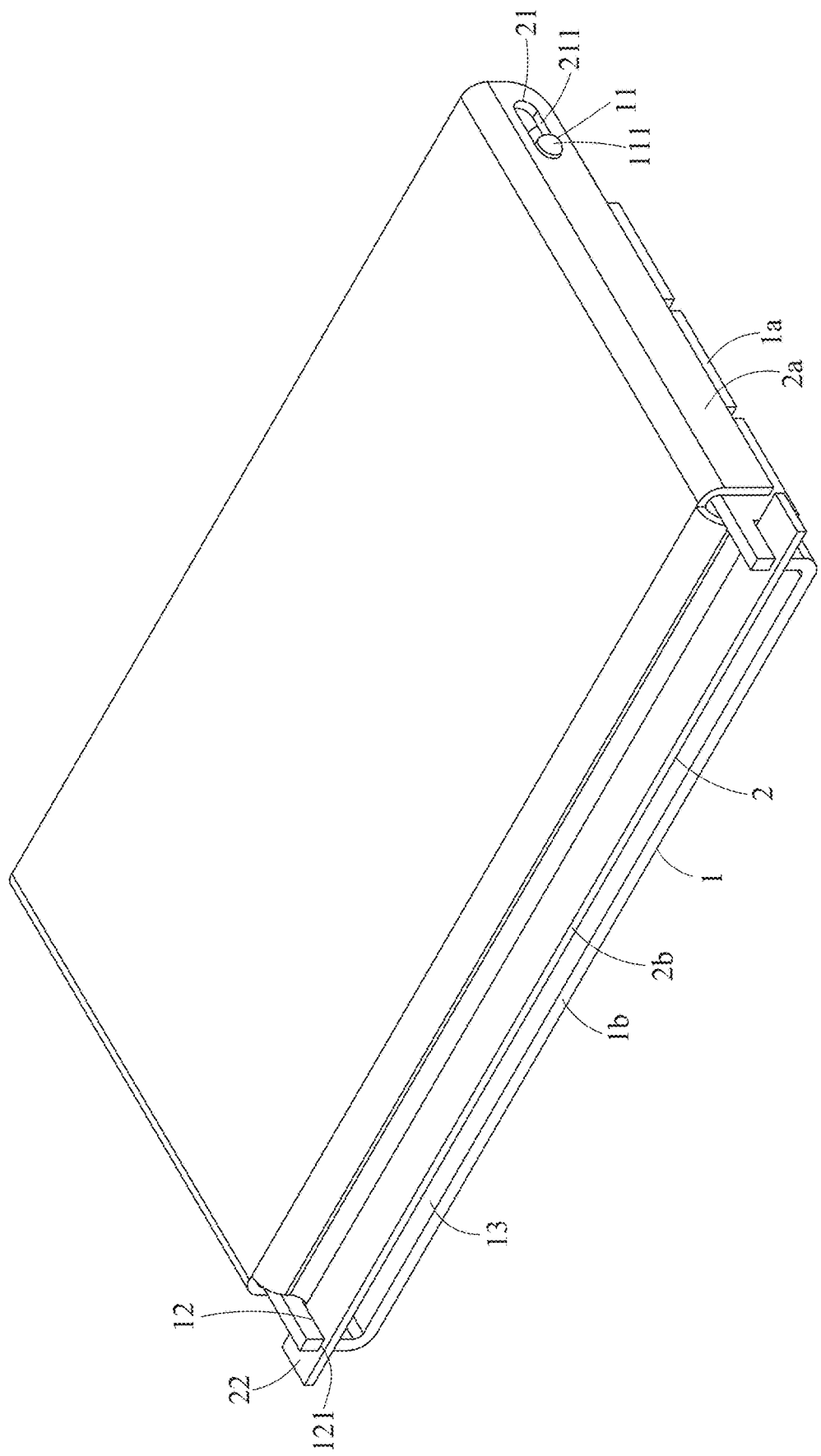
FIG. 1A illustrates a front perspective view of a shielding member according to a first embodiment of the instant disclosure.
Figure 2A:
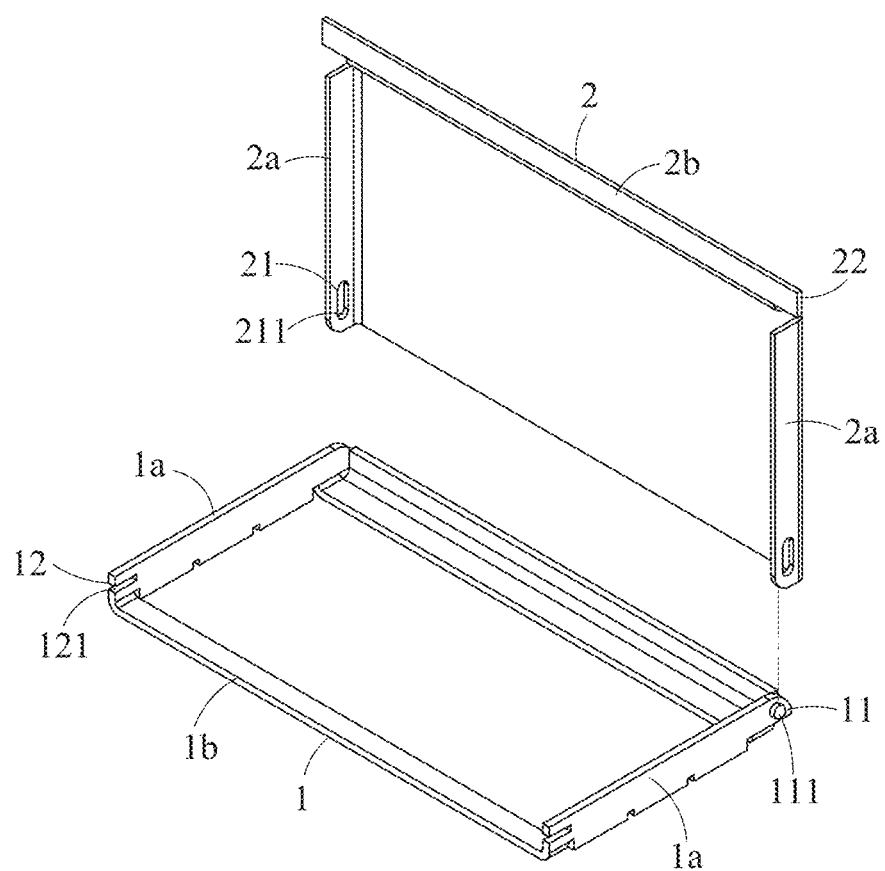
FIG. 2A illustrates an exploded view of the shielding member of the first embodiment.
Figure 3:
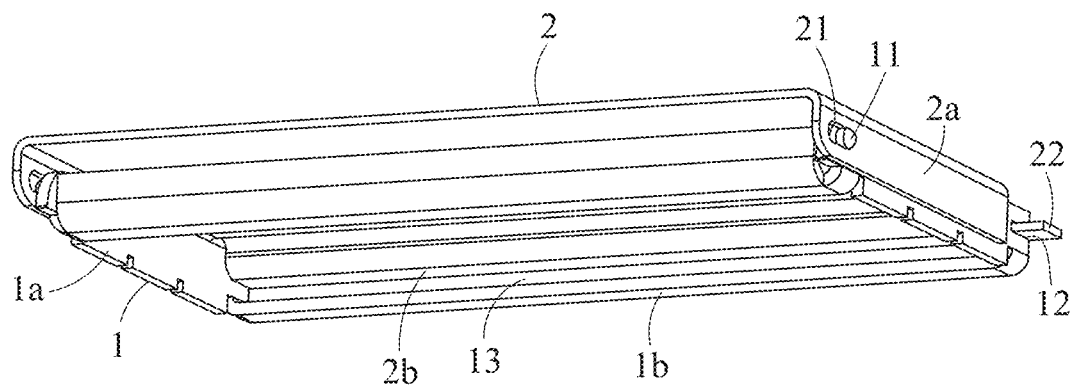
FIG. 3 illustrates a rear perspective view of the shielding member of the first embodiment.
Figure 4:
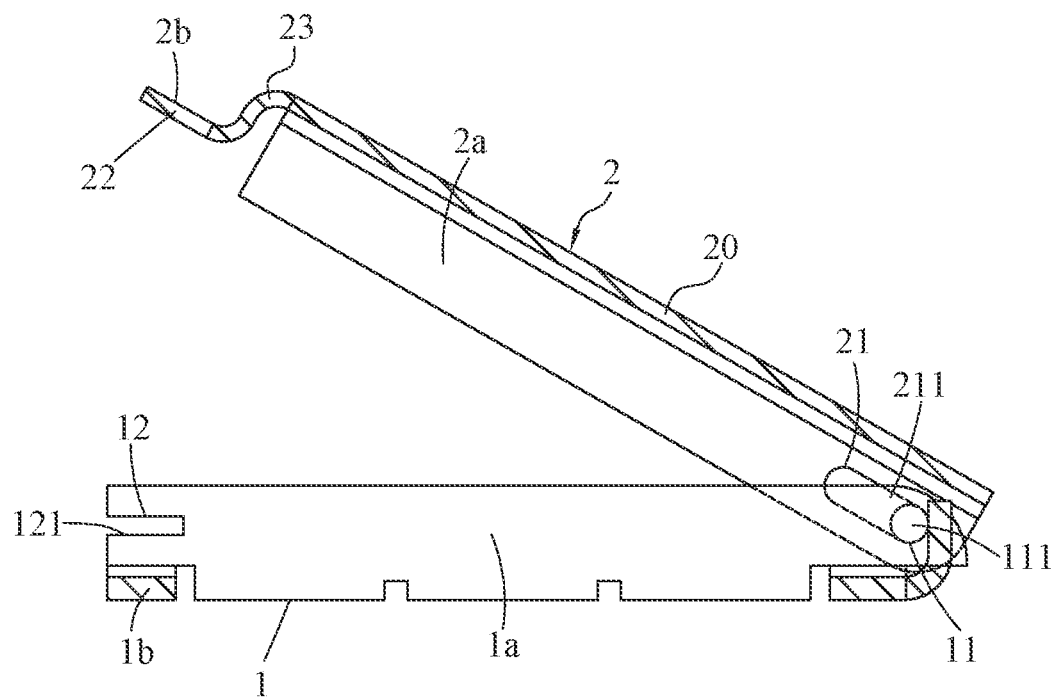
FIG. 4 illustrates a side cross-sectional view showing that the frame body is assembled with and to be covered by the outer cover, according to the shielding member of the first embodiment.
Figure 5:
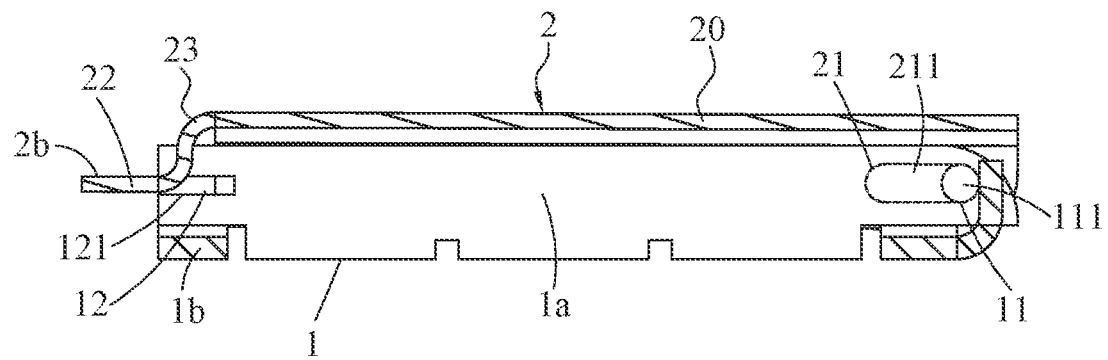
FIG. 5 illustrates a side cross-sectional view showing that the frame body is assembled with and covered by the outer cover, according to the shielding member of the first embodiment.

Please refer to FIG. 1A, FIG. 2A, and FIGS. 3 to 5. A shielding member according to a first embodiment of the instant disclosure is illustrated. FIG. 1A illustrates a front perspective view of the shielding member of the first embodiment. FIG. 2A illustrates an exploded view of the shielding member of the first embodiment. FIG. 3 illustrates a rear perspective view of the shielding member of the first embodiment. FIG. 4 illustrates a side cross-sectional view showing that the frame body is assembled with and to be cover by the outer cover, according to the shielding member of the first embodiment. FIG. 5 illustrates a side cross-sectional view showing that the frame body is assembled with and covered by the outer cover, according to the shielding member of the first embodiment. In this embodiment, the shielding member comprises a frame body 1 and an outer shell 2.

In this embodiment, two sides of a first end of the frame body 1 respectively comprise a first shaft portion 11. The frame body 1 comprises a first fixation portion 12. The frame body 1 is covered by the outer cover 2. Two sides of a first end of the outer cover 2 respectively comprise a second shaft portion 21, and each of the second shaft portions 21 is pivotally connected to the corresponding first shaft portion 11. The outer cover 2 comprises a second fixation portion 22, and the second fixation portion 22 is engaged with the first fixation portion 12. An opening 13 is formed between a second end of the frame body 1 opposite to the first end of the frame body 1 and the corresponding portion of the outer cover 2.

In this embodiment, the frame body 1 and the outer cover 2 are assembled to form a one-piece metallic shielding member. Therefore, during the surface mount technology (SMT) procedure, the shielding member can be held by the vacuum suctioning device of the SMT apparatus without using an additional plastic sheet. Moreover, a spacing (the opening 13) is formed between the outer cover 2 and the frame body 1 after the outer cover 2 is assembled with the frame body 1, so that the hot flow of the SMT procedure can enter into the shielding member from the opening 13 to ensure that the welding process for the circuit board of the board-to-board (BTB) connector and the electronic component can be performed properly.

Figure 17:
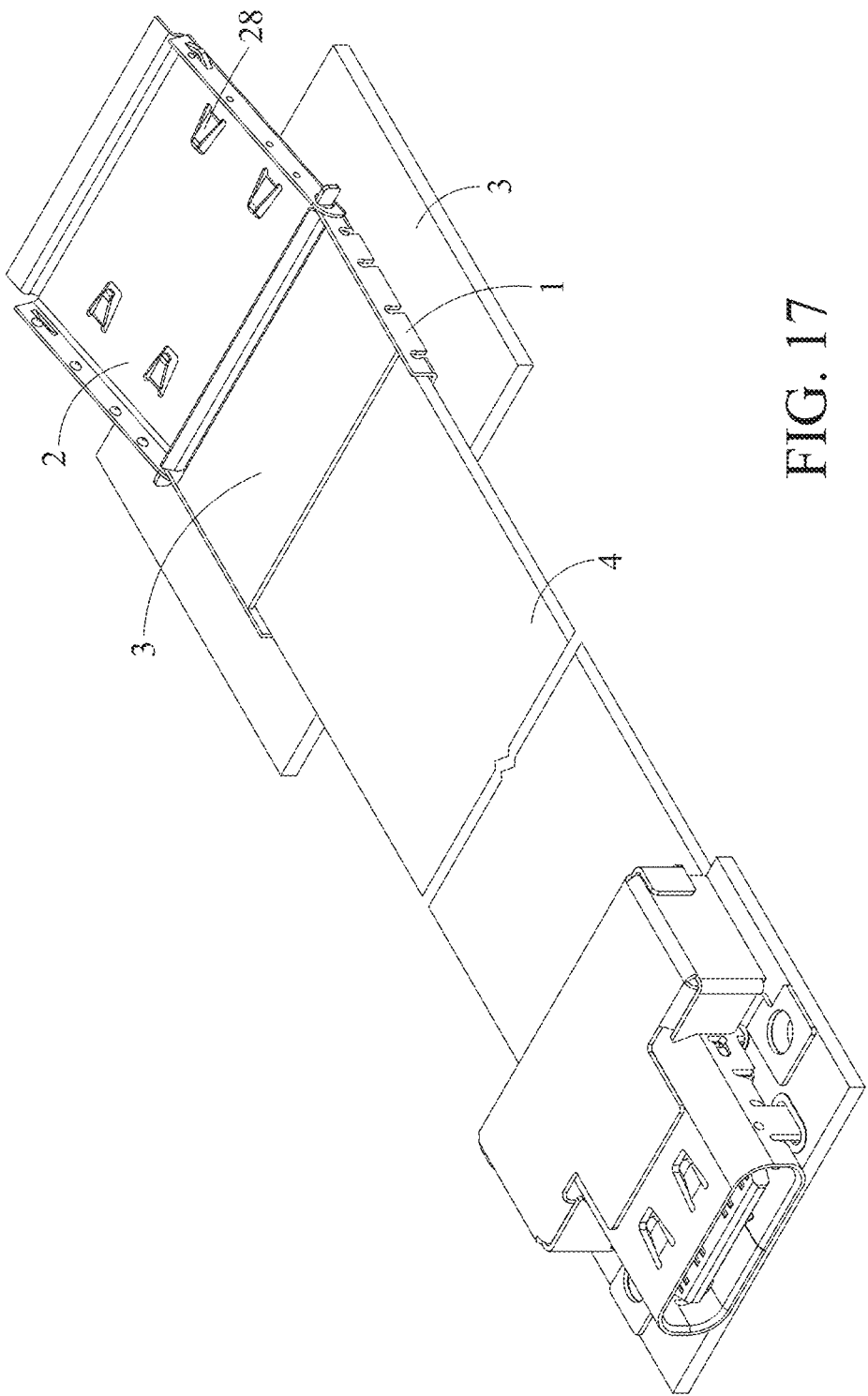
FIG. 17 illustrates a schematic view showing that the shielding member of the fifth embodiment is assembled with a circuit board, and the frame body is not covered by the outer cover.

In this embodiment, more specifically, the shielding member is adapted to cover a circuit board 3, and a board-to-board (BTB) receptacle connector is on the circuit board 3 which is adapted to be mated with a board-to-board plug connector. The board-to-board plug connector is assembled to another circuit board 3 from which a cable 4 extends (as shown in FIG. 17), and the cable 4 extends out of the shielding member from the opening 13. In other words, in this embodiment, the opening 13 is filled and shielded by the cable 4, but embodiments are not limited thereto. In some embodiments, the shielding member not only can be applied with the BTB connectors, but also can be applied with other electronic components or connectors with the EMI shielding needs.

In this embodiment, more specifically, the frame body 1 is a rectangular frame structure. Two sides of the frame body 1 respectively comprise a first side plate 1a, and the second end of the frame body 1 comprises a first bottom plate 1b. In this embodiment, the first side plates 1a are vertically arranged with respect to the first bottom plate 1b. Moreover, the outer cover 2 is a rectangular plate structure. Two sides of the outer cover 2 respectively comprise a second side plate 2a. Each of the second side plates 2a covers an outer side of the corresponding first side plate 1a. Accordingly, the shielding member can shield the component with two metallic layers. Furthermore, a second end of the outer cover 2 opposite to the first end of the outer cover 2 comprises a second block 2b corresponding to the first bottom plate 1b. In detail, as shown in FIGS. 4 and 5, the outer cover 2 further has a cover body 20 and a bent portion 23. The bent portion 23 is extended from an end of the cover body and bent downwardly. The second block 2b is extended from an end of the bent portion 23 away from the cover body 20, and extended outwardly. The second block 2b is substantially parallel to the cover body 20.

Figure 2B:
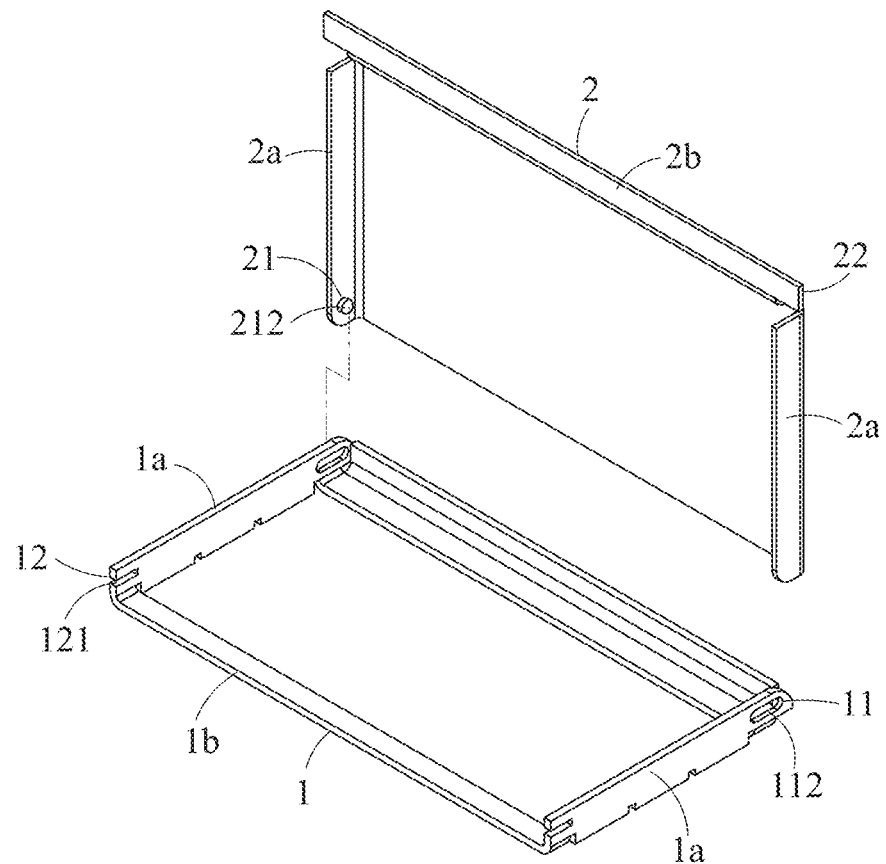
FIG. 2B illustrates an exploded view showing an implementation of the first shaft portions and the second shaft portions of the shielding member of the first embodiment.

In this embodiment, more specifically, each of the first shaft portions 11 comprises a rotation shaft 111 protruding from a side end of the corresponding first side plate 1a, each of the second shaft portions 21 comprises a shaft hole 211 formed on a side end of the corresponding second side plate 2a, and each of the rotation shafts 111 is inserted into the corresponding shaft hole 211. Specifically, in this embodiment, the shaft hole 211 is an elongated slot, so that the rotation shaft 111 is movable in the elongated slot. Moreover, the positions of the rotation shaft 111 and the shaft hole 211 may be exchanged; specifically, as shown in FIG. 2B, each of the first shaft portions 11 comprises a shaft hole 112 formed on the side end of the corresponding first side plate 1a, each of the second shaft portions 21 comprises a rotation shaft 212 protruding from the side end of the corresponding second side plate 2a, and each of the rotation shafts 212 is inserted into the corresponding shaft hole 112.

In this embodiment, more specifically, the first fixation portion 12 comprises an engaging groove 121 formed on the side end of each of the first side plates 1a, and two sides of the second block 2b are respectively engaged with the engaging grooves 121. When the outer cover 2 is stacked on and covers the frame body 1, the two sides of the second block 2b are located out of the engaging grooves 121, respectively. Then, the outer cover 2 is slid to a position above the frame body 1, and the two sides of the second block 2b are engaged with the engaging grooves 121, respectively. Moreover, because of the configuration of the second block 2b outwardly extending from the second end of the outer cover 2, when a user or operator wants to open the outer cover 2, the user or operator can tap the second block 2b with hands or tools to detach the two sides of the second block 2b from the engaging grooves 121 and then open the outer cover 2. In other words, since the front edge of the second block 2b is protruding outwardly and the two sides of the second block 2b are respectively protruding out of the engaging grooves 121, the user or operator can open the outer cover 2 conveniently.

Figure 1B:
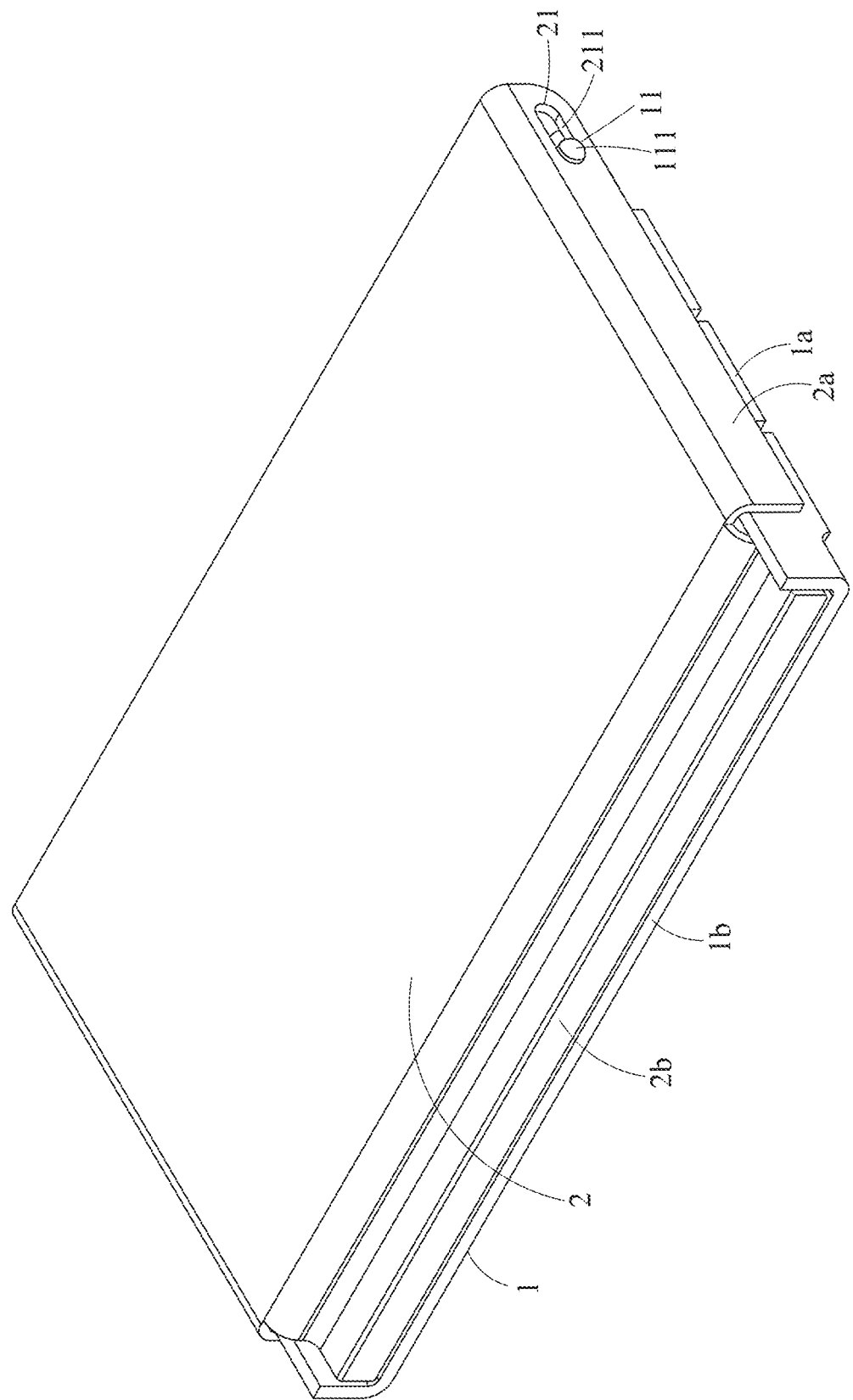
FIG. 1B illustrates a front perspective view showing an implementation of the shielding member of the first embodiment.

Please refer to FIG. 1B. Moreover, the second block 2b extends toward the first bottom plate 1b and covers the opening 13. Hence, the opening 13 can be shielded so as to improve the electromagnetic interference (EMI)/radio frequency interference (RFI) problems upon the shielded component transmits high-speed signals.

Figure 6:
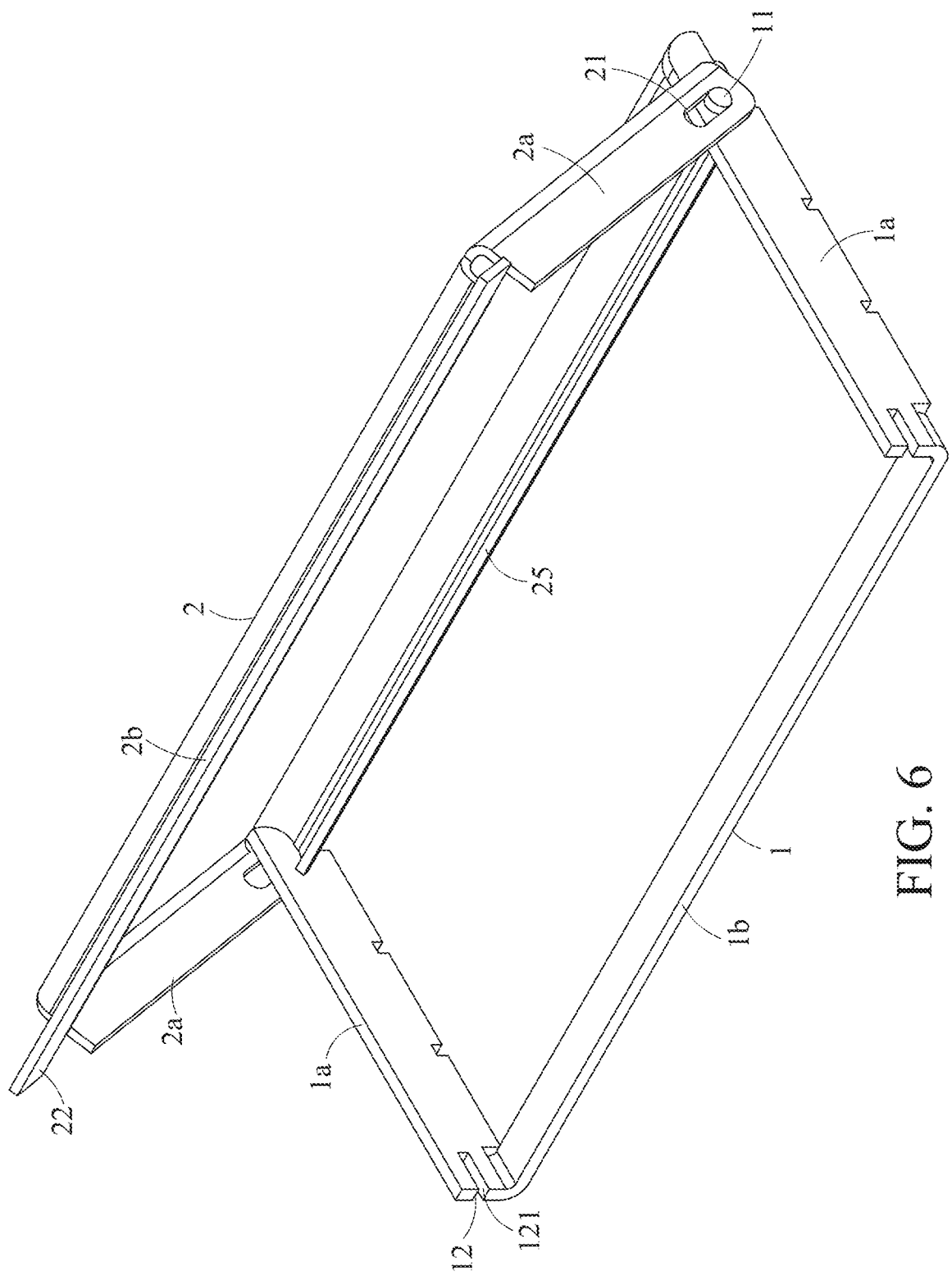
FIG. 6 illustrates a perspective view of a shielding member according to a second embodiment of the instant disclosure.
Figure 7:
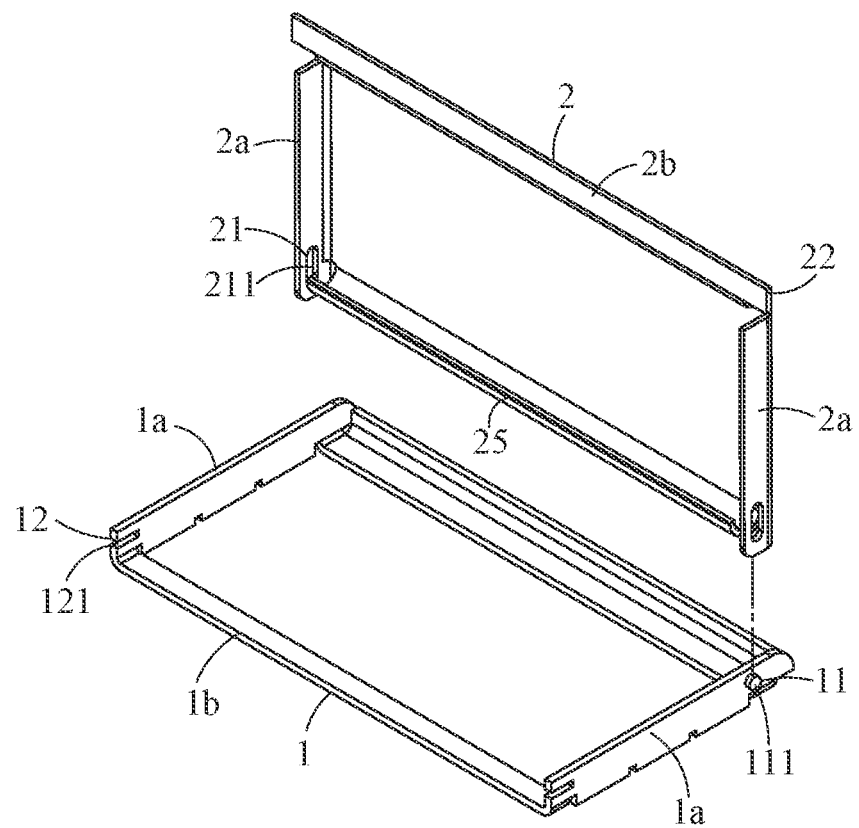
FIG. 7 illustrates an exploded view of the shielding member of the second embodiment.
Figure 8:
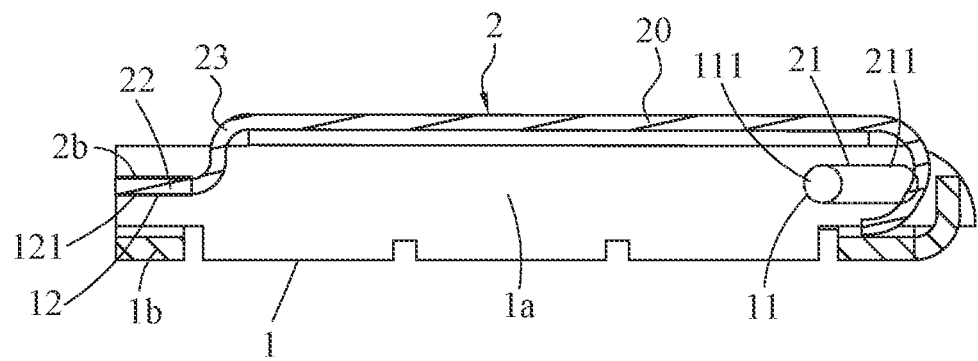
FIG. 8 illustrates a side cross-sectional view showing that the frame body is assembled with and covered by the outer cover, according to the shielding member of the second embodiment.
Figure 9:
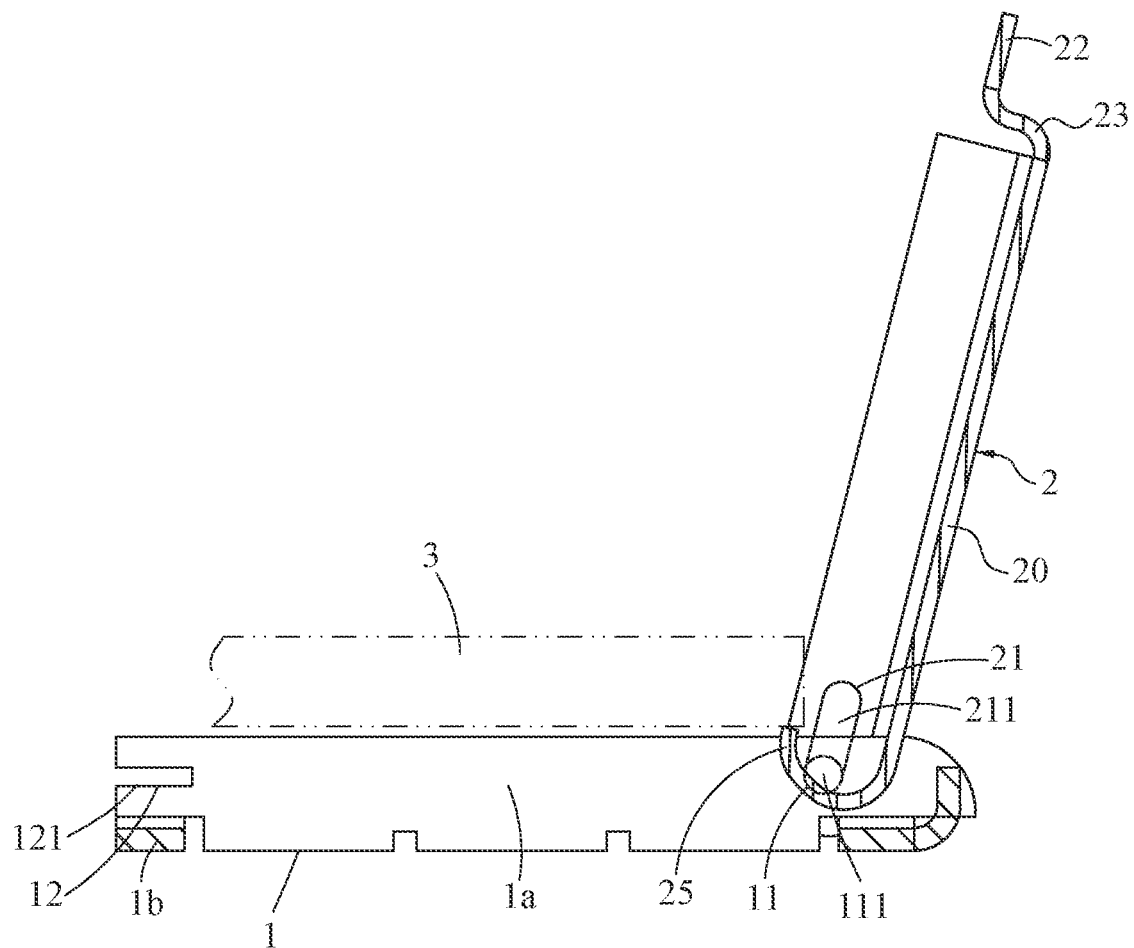
FIG. 9 illustrates a side cross-sectional view showing that the frame body is assembled with and not covered by the outer cover, according to the shielding member of the second embodiment.

Please refer to FIGS. 6 to 9. A shielding member according to a second embodiment of the instant disclosure is illustrated. FIG. 6 illustrates a perspective view of the shielding member of the second embodiment. FIG. 7 illustrates an exploded view of the shielding member of the second embodiment. FIG. 8 illustrates a side cross-sectional view showing that the frame body is assembled with and covered by the outer cover, according to the shielding member of the second embodiment. FIG. 9 illustrates a side cross-sectional view showing that the frame body is assembled with and not covered by the outer cover, according to the shielding member of the second embodiment. In this embodiment, a top plate 25 reversely extends from the first end of the outer cover 2, and an end portion of the top plate 25 extends into the frame body 1. During opening the outer cover 2, after the outer cover 2 is rotated by a certain degree, the outer cover 2 can push the circuit board 3 inside the frame body 1 to detach the board-to-board receptacle connector on the circuit board 3 from the board-to-board plug connector.

Figure 10:
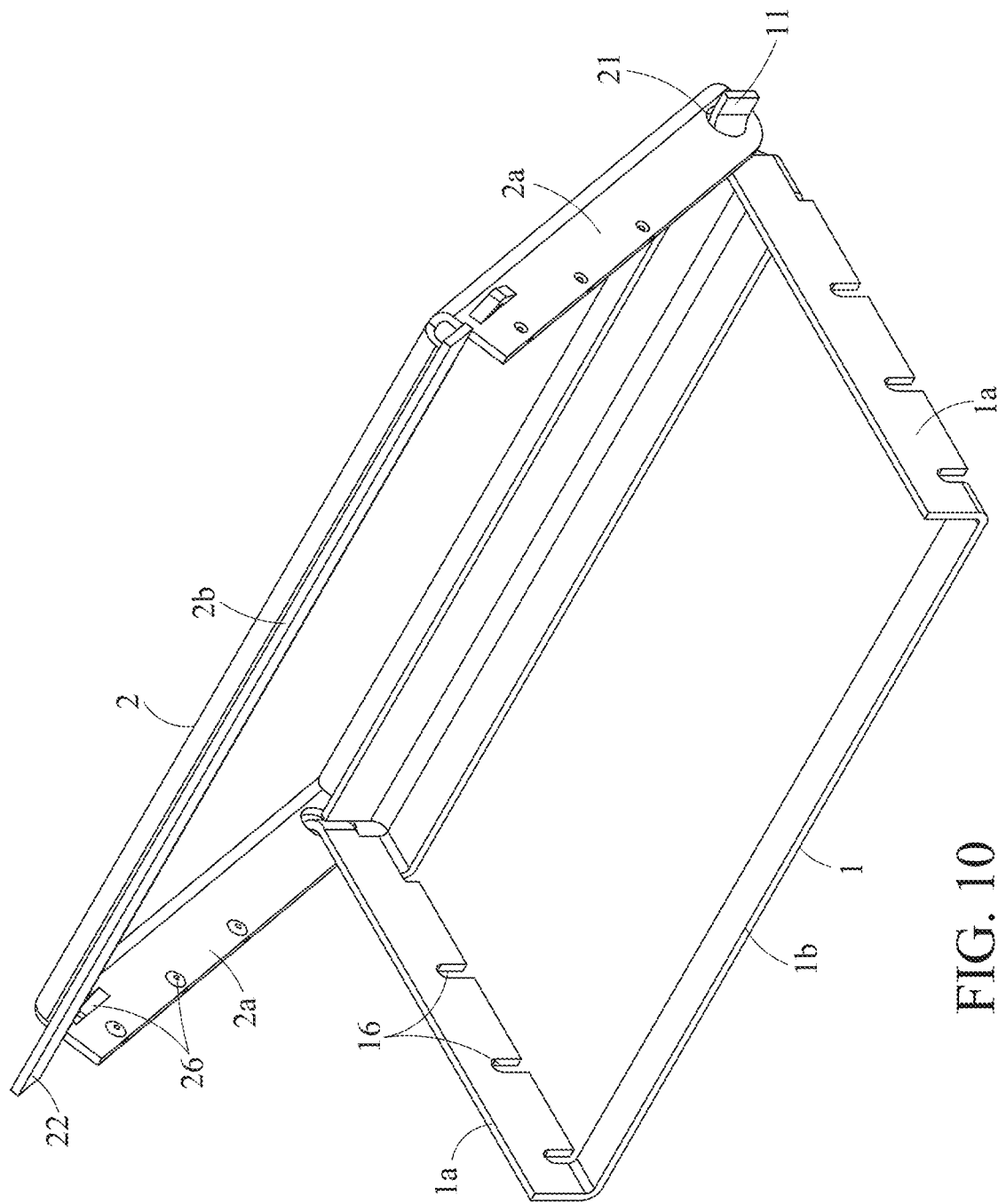
FIG. 10 illustrates a perspective view of a shielding member according to a third embodiment of the instant disclosure.
Figure 11:
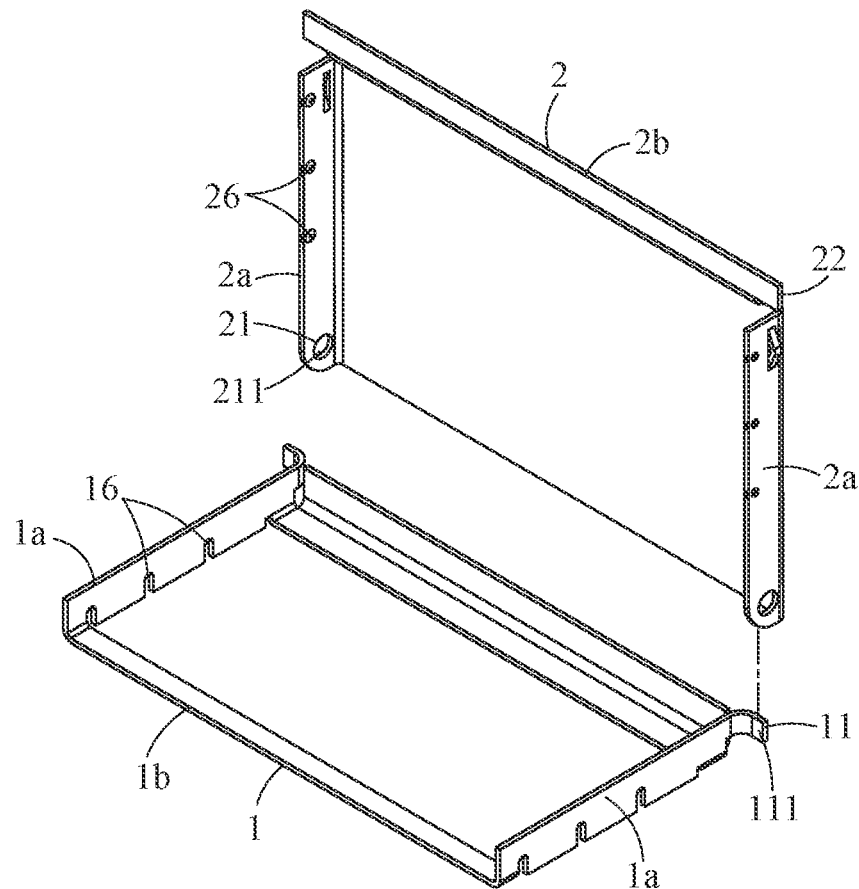
FIG. 11 illustrates an exploded view of the shielding member of the third embodiment.
Figure 12:
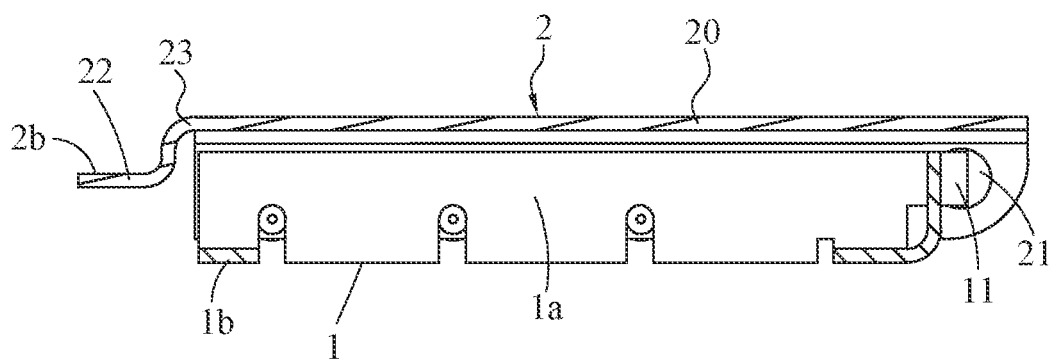
FIG. 12 illustrates a side cross-sectional view showing that the frame body is assembled with and covered by the outer cover, according to the shielding member of the third embodiment.

Please refer to FIGS. 10 to 12. A shielding member according to a third embodiment of the instant disclosure is illustrated. FIG. 10 illustrates a perspective view of the shielding member of the third embodiment. FIG. 11 illustrates an exploded view of the shielding member of the third embodiment. FIG. 12 illustrates a side cross-sectional view showing that the frame body 1 is assembled with and covered by the outer cover 2, according to the shielding member of the third embodiment. In this embodiment, each of the first side plates 1a of the frame body 1 comprises a plurality of first engaging portions 16, and the first engaging portions 16 are spacedly configured on each of the first side plates 1a. Moreover, in this embodiment, each of the second side plates 2a of the outer cover 2 comprises a plurality of second engaging portions 26, and the second engaging portions 26 of each of the second side plates 2a are respectively engaged with the first engaging portions 16 of the corresponding first side plate 1a and an inner wall of the corresponding first side plate 1a. When the outer cover 2 is stacked on and covers the frame body 1, the second engaging portions 26 of each of the second side plates 2a are respectively in contact with the inner wall of the corresponding first side plate 1a and are respectively engaged with the first engaging portions 16 of the corresponding first side plate 1a, so that the frame body 1 and the outer cover 2 are stably fixed with each other. In this embodiment, the first engaging portion 16 of the first side plate 1a is a recessed structure, the second engaging portion 26 of the second side plate 2a is a protruding structure, and the protruding structure is engaged with the recessed structure, but embodiments are not limited thereto. In some embodiments, the first engaging portion 16 of the first side plate 1a may be a protruding structure, the second engaging portion 26 of the second side plate 2a may be a recessed structure, and the protruding structure is engaged with the recessed structure.

Figure 13:
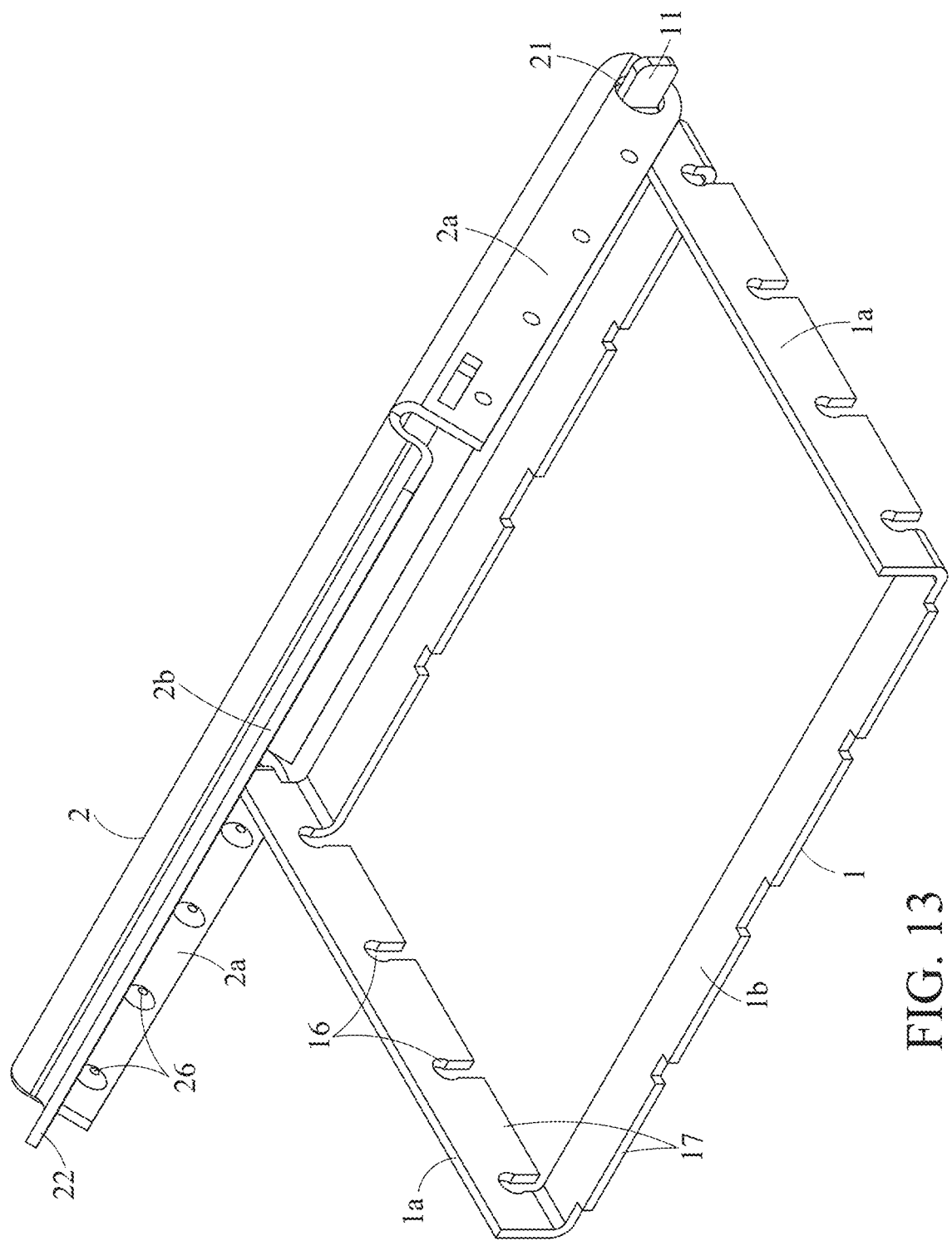
FIG. 13 illustrates a perspective view of a shielding member according to a fourth embodiment of the instant disclosure.
Figure 14:
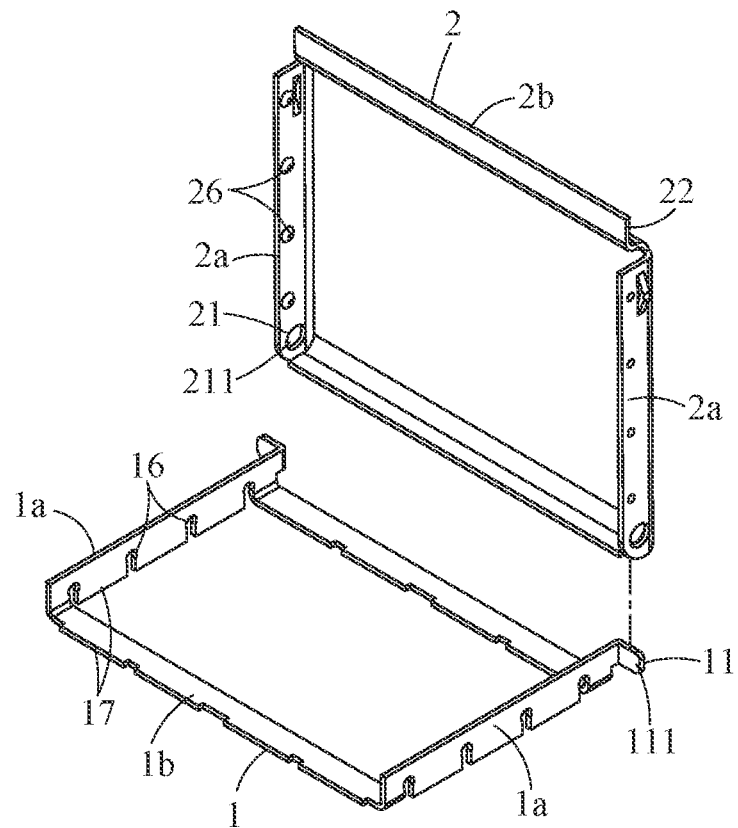
FIG. 14 illustrates an exploded view of the shielding member of the fourth embodiment.
Figure 15:
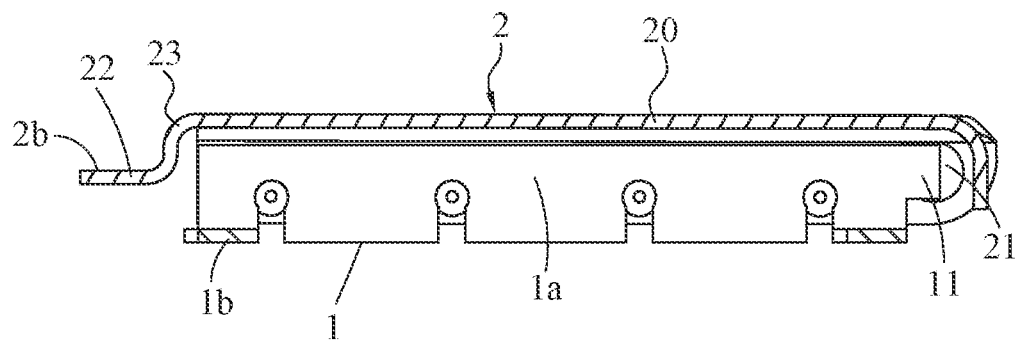
FIG. 15 illustrates a side cross-sectional view showing that the frame body is assembled with and covered by the outer cover, according to the shielding member of the fourth embodiment.

Please refer to FIGS. 13 to 15. A shielding member according to a fourth embodiment of the instant disclosure is illustrated. FIG. 13 illustrates a perspective view of the shielding member of the fourth embodiment. FIG. 14 illustrates an exploded view of the shielding member of the fourth embodiment. FIG. 15 illustrates a side cross-sectional view showing that the frame body 1 is assembled with and covered by the outer cover 2, according to the shielding member of the fourth embodiment. In this embodiment, the frame body 1 comprises a plurality of leg portions 17 at the first side plates 1a and the first bottom plate 1b. The leg portions 17 may be welded on the circuit board 3, thereby improving the protection performance for EMI/RFI.

Figure 16:
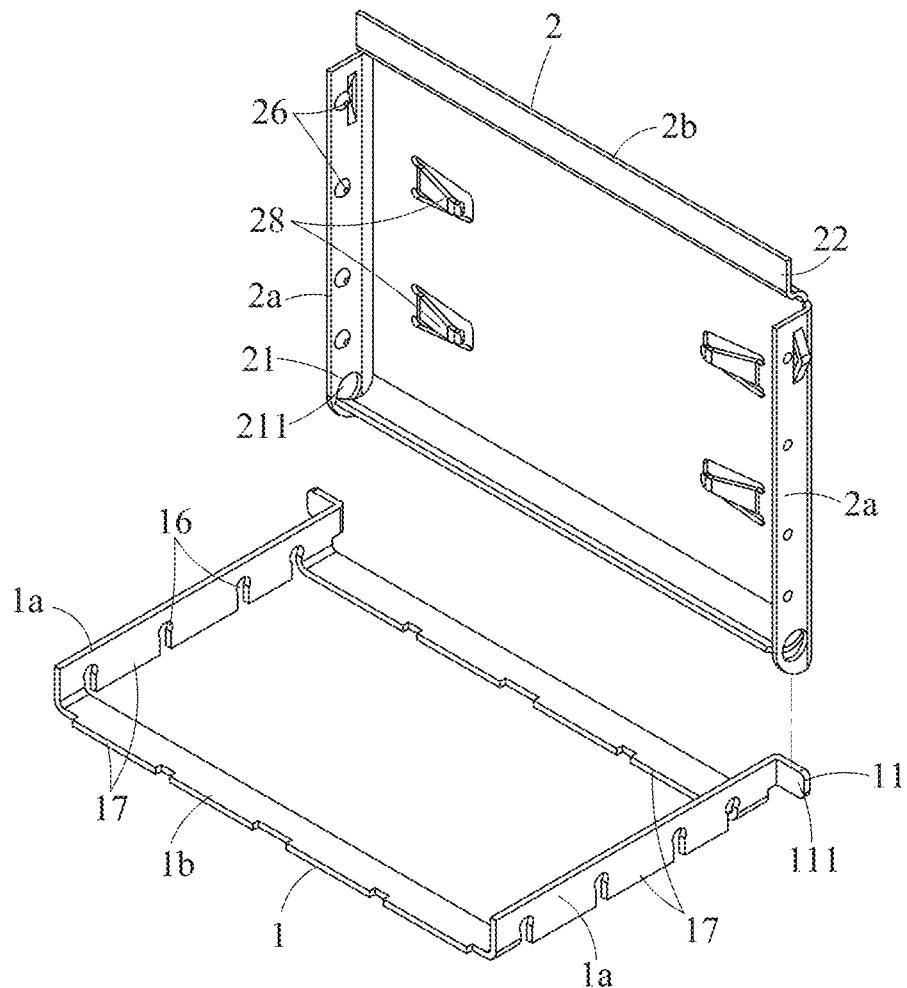
FIG. 16 illustrates an exploded view of a shielding member according to a fifth embodiment of the instant disclosure.
Figure 18:
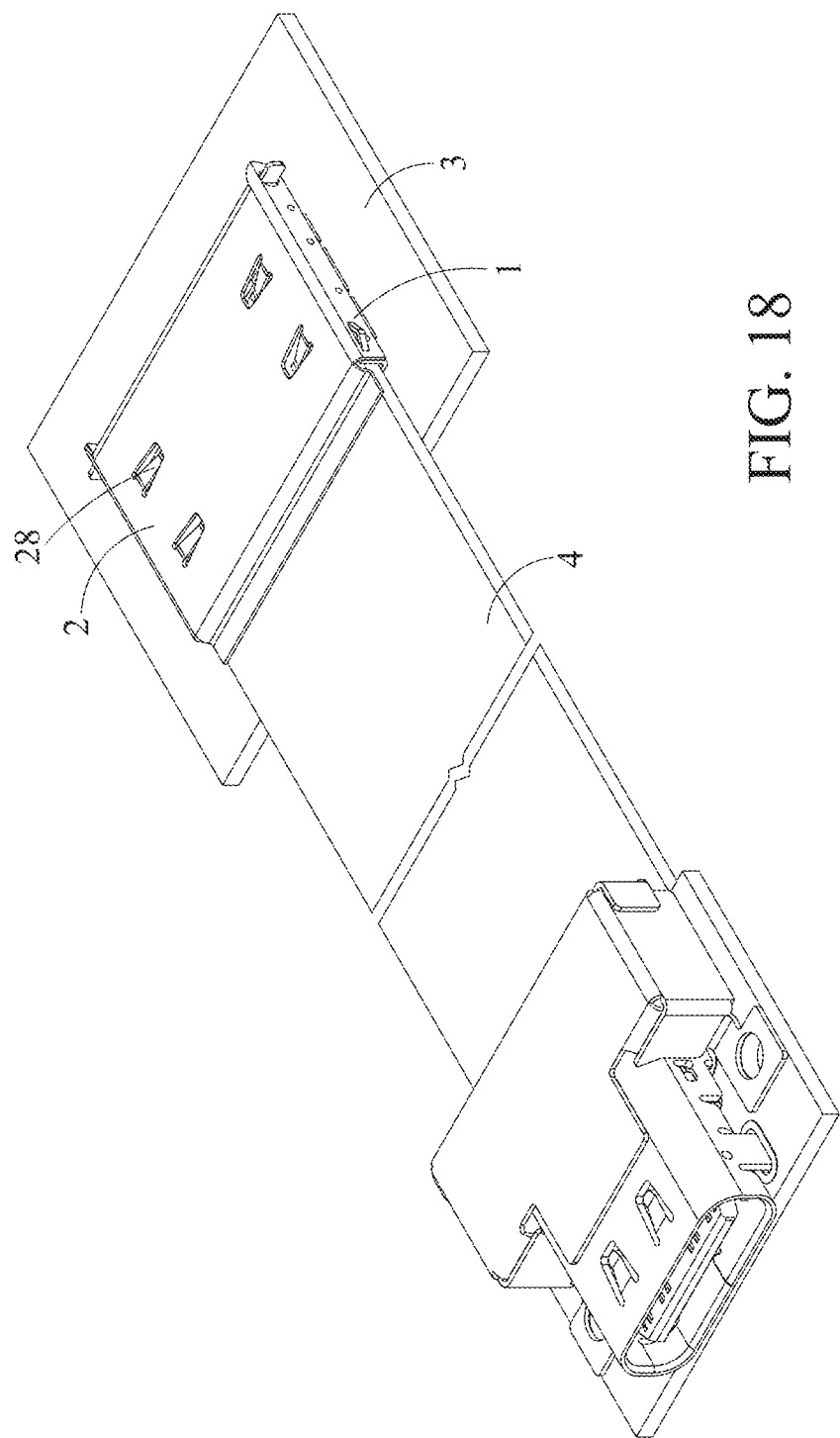
FIG. 18 illustrates a schematic view showing that the shielding member of the fifth embodiment is assembled with a circuit board, and the frame body is covered by the outer cover.

Please refer to FIGS. 16 to 18. A shielding member according to a fifth embodiment of the instant disclosure is illustrated. FIG. 16 illustrates an exploded view of the shielding member of the fifth embodiment. FIG. 17 illustrates a schematic view showing that the shielding member of the fifth embodiment is assembled with a circuit board 3, and the frame body 1 is not covered by the outer cover 2. FIG. 18 illustrates a schematic view showing that the shielding member of the fifth embodiment is assembled with the circuit board 3, and the frame body 1 is covered by the outer cover 2. In this embodiment, a fixation member 28 is on a surface of the outer cover 2 for contacting a circuit board 3. In this embodiment, the shielding member may have one or several fixation members 28, and the fixation member 28 may be an elastic piece for contacting the contact points (GND) of the circuit board 3 (PCB) or the flexible printed circuit board (FPCB), thereby improving the protection performance for EMI as well as enhancing the fixation for the PCB/PFCB. The gaps between the elastics pieces allow the hot flow of the SMT procedure to enter into the shielding member to ensure that the welding process for the circuit board of the board-to-board (BTB) connector and the electronic component can be performed properly.

In some embodiments, the fixation member(s) 28 may be one or more screws, and the surface of the outer cover 2 has bolt hole(s) corresponding to the screw(s). The screw is threaded into the bolt hole and is fixed on the circuit board 3. The screw may be adapted to contact the nuts and the contact points (GND) on the circuit board 3, thereby improving the protection performance for EMI.

In this embodiment, the circuit board enclosed by the shielding member is connected to one of two ends of the cable (as shown in FIG. 17), and the other end of the cable is connected to a USB type-C electrical connector or electrical connectors with other specifications, but embodiments are not limited thereto. In some embodiments, the shielding member can be applied to not only board-to-board (BTB) connectors but also other electronic components or connectors with the EMI shielding needs.

According to one or some embodiments of the instant disclosure, the frame body and the outer cover are assembled to form a one-piece metallic shielding member. The structure of the shielding member is simple, the manufacturing for the shielding member is easy, and the cost for manufacturing the shielding member is reduced. The shielding member is adapted to provide a great EMI protection. The outer cover is rotatable on the frame body, so that the detachment of the shielding member from the shielded electronic component as well as the assembly of the shielding member can be achieved easily. Hence, the assembly time and the rework time for the shielding member can be reduced. The shielding member can be fixed on the shielded electronic component without using screws. A one-time surface mount technology (SMT) procedure may be applied to a connector or an electronic component assembled with the shielding member, and the shielding member can be applied to board-to-board (BTB) connectors or other electronic components or connectors with the EMI shielding needs. The two sides of the frame body are covered by the two sides of the outer cover, so that the shielding member can shield the component with two metallic layers.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A shielding member, comprising:
a frame body, wherein two sides of a first end of the frame body respectively comprise a first shaft portion, wherein two sides of the frame body respectively comprise a first side plate; and
an outer cover, covering the frame body, wherein two sides of a first end of the outer cover respectively comprise a second shaft portion, and each of the second shaft portions is pivotally connected to the corresponding first shaft portion, wherein two sides of the outer cover respectively comprise a second side plate, and each of the second side plates covers an outer side of the corresponding first side plate, wherein a top plate reversely extends from the first end of the outer cover, and an end portion of the top plate extends into the frame body.

2. The shielding member according to claim 1, wherein a second end of the frame body opposite to the first end of the frame body comprises a first bottom plate, a second end of the outer cover opposite to the first end of the outer cover comprises a second block, and an opening is formed between the first bottom plate and the second block.

3. The shielding member according to claim 2, wherein the frame body comprises a plurality of leg portions at the first side plates and the first bottom plate.

4. The shielding member according to claim 1, wherein each of the first shaft portions comprises a rotation shaft protruding from a side end of the corresponding first side plate, each of the second shaft portions comprises a shaft hole formed on a side end of the corresponding second side plate, and each of the rotation shafts is inserted into the corresponding shaft hole.

5. The shielding member according to claim 1, wherein each of the first shaft portions comprises a shaft hole formed on a side end of the corresponding first side plate, each of the second shaft portions comprises a rotation shaft protruding from a side end of the corresponding second side plate, and each of the rotation shafts is inserted into the corresponding shaft hole.

6. The shielding member according to claim 1, wherein the frame body comprises a first fixation portion, the outer cover comprises a second fixation portion, and the second fixation portion is engaged with the first fixation portion; the first fixation portion comprises an engaging groove formed on a side end of each of the first side plates, and two sides of the second block are respectively engaged with the engaging grooves.

7. A shielding member, comprising:
a frame body, wherein two sides of a first end of the frame body respectively comprise a first shaft portion, wherein two sides of the frame body respectively comprise a first side plate; and
an outer cover, covering the frame body, wherein two sides of a first end of the outer cover respectively comprise a second shaft portion, and each of the second shaft portions is pivotally connected to the corresponding first shaft portion, wherein two sides of the outer cover respectively comprise a second side plate, and each of the second side plates covers an outer side of the corresponding first side plate;

wherein each of the first side plates comprises a plurality of first engaging portions, the first engaging portions are spacedly configured on each of the first side plates, each of the second side plates comprises a plurality of second engaging portions, and the second engaging portions of each of the second side plates are respectively engaged with the first engaging portions of the corresponding first side plate and an inner wall of the corresponding first side plate.

8. The shielding member according to claim 1, wherein a fixation member is on a surface of the outer cover for contacting a circuit board.

9. A shielding member, comprising:

a frame body, wherein two sides of a first end of the frame body respectively comprise a first shaft portion, wherein two sides of the frame body respectively comprise a first side plate, wherein a second end of the frame body opposite to the first end of the frame body comprises a first bottom plate, a second end of the outer cover opposite to the first end of the outer cover comprises a second block, and an opening is formed between the first bottom plate and the second block; and an outer cover, covering the frame body, wherein two sides of a first end of the outer cover respectively comprise a second shaft portion, and each of the second shaft portions is pivotally connected to the corresponding first shaft portion, wherein two sides of the outer cover respectively comprise a second side plate, and each of the second side plates covers an outer side of the corresponding first side plate, and outer cover comprises a cover body, a bent portion and a second block, the bent portion is extended from an end of the cover body and bent downwardly, the second block is extended from an end of the bent portion away from the cover body and extended outwardly, and the second block is substantially parallel to the cover body;

wherein a second end of the frame body opposite to the first end of the frame body comprises a first bottom plate, the second block is at a second end of the outer cover opposite to the first end of the outer cover, and an opening is formed between the first bottom plate and the second block.

10. The shielding member according to claim 9, wherein a second end of the frame body opposite to the first end of the frame body comprises a first bottom plate, a second end of the outer cover opposite to the first end of the outer cover comprises a second block, and an opening is formed between the first bottom plate and the second block.

11. The shielding member according to claim 9, wherein each of the first shaft portions comprises a rotation shaft protruding from a side end of the corresponding first side plate, each of the second shaft portions comprises a shaft hole formed on a side end of the corresponding second side plate, and each of the rotation shafts is inserted into the corresponding shaft hole.

12. The shielding member according to claim 9, wherein each of the first shaft portions comprises a shaft hole formed on a side end of the corresponding first side plate, each of the second shaft portions comprises a rotation shaft protruding from a side end of the corresponding second side plate, and each of the rotation shafts is inserted into the corresponding shaft hole.

13. The shielding member according to claim 9, wherein the frame body comprises a first fixation portion, the outer cover comprises a second fixation portion, and the second fixation portion is engaged with the first fixation portion; the first fixation portion comprises an engaging groove formed on a side end of each of the first side plates, and two sides of the second block are respectively engaged with the engaging grooves.

14. The shielding member according to claim 9, wherein a top plate reversely extends from the first end of the outer cover, and an end portion of the top plate extends into the frame body.

15. The shielding member according to claim 9, wherein each of the first side plates comprises a plurality of first engaging portions, the first engaging portions are spacedly configured on each of the first side plates, each of the second side plates comprises a plurality of second engaging portions, and the second engaging portions of each of the second side plates are respectively engaged with the first engaging portions of the corresponding first side plate and an inner wall of the corresponding first side plate.

16. The shielding member according to claim 10, wherein the frame body comprises a plurality of leg portions at the first side plates and the first bottom plate.

17. The shielding member according to claim 9, wherein a fixation member is on a surface of the outer cover for contacting a circuit board.

\* \* \* \* \*